US011031339B2

(12) United States Patent
Patlolla et al.

(10) Patent No.: US 11,031,339 B2
(45) Date of Patent: Jun. 8, 2021

(54) METAL INTERCONNECTS

(71) Applicant: International Business Machines Corporation, Armonk, NY (US)

(72) Inventors: Raghuveer R. Patlolla, Guilderland, NY (US); Cornelius Brown Peethala, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/687,833

(22) Filed: Nov. 19, 2019

(65) Prior Publication Data

US 2020/0083169 A1    Mar. 12, 2020

Related U.S. Application Data

(62) Division of application No. 15/962,045, filed on Apr. 25, 2018.

(51) Int. Cl.
| | |
|---|---|
| *H01L 23/532* | (2006.01) |
| *H01L 21/768* | (2006.01) |
| *H01L 21/3213* | (2006.01) |
| *H01L 21/288* | (2006.01) |
| *H01L 21/48* | (2006.01) |

(52) U.S. Cl.
CPC ........ *H01L 23/5329* (2013.01); *H01L 21/288* (2013.01); *H01L 21/32134* (2013.01); *H01L 21/4846* (2013.01); *H01L 21/76834* (2013.01); *H01L 21/76849* (2013.01); *H01L 21/76879* (2013.01); *H01L 23/53233* (2013.01); *H01L 23/53238* (2013.01)

(58) Field of Classification Search
CPC ........... H01L 23/5329; H01L 21/76879; H01L 21/288; H01L 21/32134; H01L 21/76849; H01L 21/76834; H01L 21/4846; H01L 21/76883
See application file for complete search history.

(56) References Cited

U.S. PATENT DOCUMENTS

| | | | |
|---|---|---|---|
| 5,098,860 | A | 3/1992 | Chakravorty et al. |
| 5,604,156 | A | 2/1997 | Chung et al. |
| 5,930,669 | A | 7/1999 | Uzoh |
| 5,933,753 | A | 8/1999 | Simon et al. |
| 6,251,786 | B1 | 6/2001 | Zhou |
| 6,323,554 | B1 | 11/2001 | Joshi et al. |
| 6,368,953 | B1 | 4/2002 | Petrarca |

(Continued)

FOREIGN PATENT DOCUMENTS

CN    104217993 A    12/2014

OTHER PUBLICATIONS

List of IBM Patents or Patent Applications Treated as Related; (Appendix P), Date Filed Nov. 19, 2019; 2 pages.

*Primary Examiner* — Hoang-Quan Ho
(74) *Attorney, Agent, or Firm* — Cantor Colburn LLP; L. Jeffrey Kelly

(57) ABSTRACT

Interconnect structures and processes of fabricating the interconnect structures generally includes a recessed metal conductor and a discontinuous capping layer thereon. The discontinuous "capped" metal interconnect structure provides improved performance and reliability for the semiconductor industry.

13 Claims, 3 Drawing Sheets

(56) References Cited

U.S. PATENT DOCUMENTS

| | | |
|---|---|---|
| 6,429,519 B1 | 8/2002 | Uzoh |
| 6,706,625 B1 | 3/2004 | Sudijono et al. |
| 6,943,451 B2 | 9/2005 | Whitehair et al. |
| 6,975,032 B2 | 12/2005 | Chen et al. |
| 7,338,908 B1 | 3/2008 | Koos et al. |
| 7,915,166 B1 | 3/2011 | Yu |
| 8,404,582 B2 | 3/2013 | Horak et al. |
| 2009/0039512 A1* | 2/2009 | Yang ................ H01L 21/76834 257/751 |
| 2012/0007257 A1* | 1/2012 | Nomura .............. H01L 23/5329 257/774 |
| 2015/0255340 A1* | 9/2015 | Duong .............. H01L 21/76883 257/751 |
| 2019/0027537 A1* | 1/2019 | Wiegand ............. H01F 10/3254 |
| 2019/0333857 A1 | 10/2019 | Patlolla et al. |

\* cited by examiner

METAL INTERCONNECTS

DOMESTIC PRIORITY

This application is a divisional of U.S. application Ser. No. 15/962,045 entitled "METAL INTERCONNECTS," filed Apr. 25, 2018 incorporated herein by reference in its entirety.

BACKGROUND

The present invention generally relates to semiconductor integrated circuits, and more particularly, to the structure and formation of metal interconnect structures.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL processing to complete the integrated circuit structure. As such, BEOL processing generally involves the formation of insulators and conductive wiring.

SUMMARY

Embodiments of the present invention are generally directed to semiconductor structures including one or more metal interconnect layers and methods of fabrication. A non-limiting example of the semiconductor structure includes an interlayer dielectric including one or more openings. A bulk metal is disposed in the one or more openings, wherein the bulk metal is recessed below an uppermost surface of the interlayer dielectric. A capping material is provided on the upper surface of the bulk metal, wherein the capping material and the interlayer dielectric have coplanar uppermost surfaces to define a discontinuous layer of the capping material.

A non-limiting example of the semiconductor structure includes an interlayer dielectric including one or more openings. A conformal liner layer lines the one or more openings and a bulk metal is disposed in the one or more openings, wherein the bulk metal and the conformal liner layer are recessed below an uppermost surface of the interlayer dielectric. A capping material is on the upper surface of the bulk metal, wherein the capping material and the interlayer dielectric have coplanar uppermost surfaces to define a discontinuous layer of the capping material over the bulk metal.

A non-limiting example of the process for forming one or more metal interconnect layers includes lithographically patterning and etching an interlayer dielectric to form one or more openings. A metal is deposited into the one or more openings. A surface is planarized to remove an excess of the metal such that the uppermost surfaces of the metal and the interlayer dielectric are coplanar to each other. A portion of the metal is removed to form a recess, wherein the uppermost surface of the metal is below the uppermost surface of the interlayer dielectric. A capping layer is deposited thereon to fill the recess. A surface is planarized to remove excess capping layer such that the uppermost surfaces of the capping layer and the interlayer dielectric are coplanar to each other and the uppermost surface of the metal is below the uppermost surfaces of the capping layer and the interlayer dielectric.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
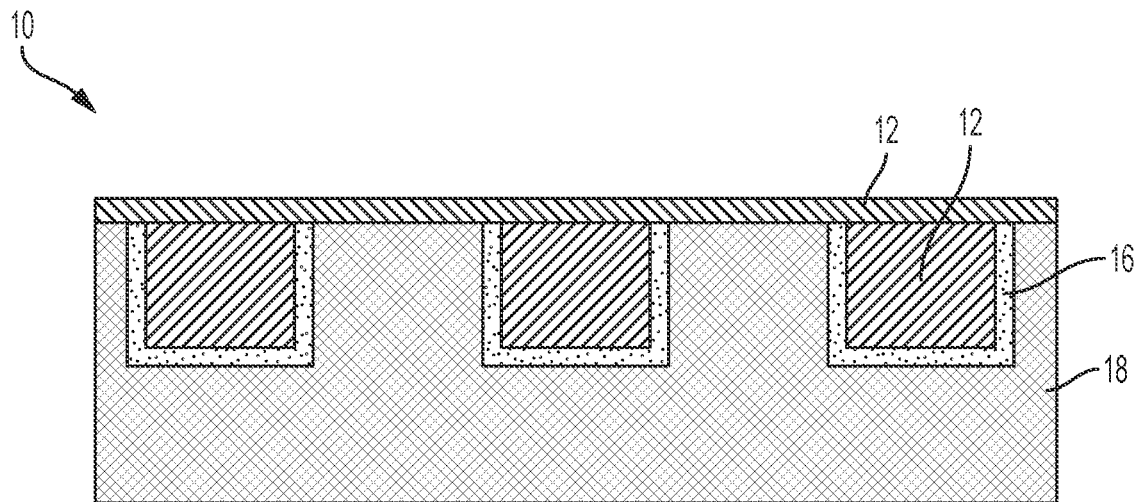
FIG. 1 depicts a cross section of an exemplary interconnect structure including a continuous capping layer.

The present invention generally relates to an interconnect structure and process for forming the interconnect structures. The structures and processes generally include formation of a discontinuous dielectric capping layer on an interconnect structure. Previous interconnect structures generally include a continuous dielectric capping layer overlaying the metal and liner interconnect features provided in an interlayer dielectric. As such, the continuous capping layer covers the interlayer dielectric in addition to the metal and liner features. FIG. 1 provides a cross sectional view of an exemplary interconnect structure 10 that includes a continuous dielectric capping layer 12. The continuous dielectric capping layer overlays a plurality of metal 14 and liner 16 interconnect features formed in an interlayer dielectric 18 subsequent to planarization.

In one or more embodiments of the invention, the interconnect structure includes recessed metal and liner interconnect features formed in an interlayer dielectric and a capping layer provided within the recess. The discontinuous "capped" metal interconnect structure provides improved performance and reliability for the semiconductor industry. As will be described in greater detail, by recessing the metal within the interlayer dielectric, the corner-to-corner distance between adjacent capped metal interconnect structures increases, which reduces the probability of dielectric breakdown. Moreover, the interconnects between the different metal levels also increases, which also serves to decrease the probability of dielectric breakdown. The corner-to-corner distance between adjacent metal interconnects is relatively shorter for the interconnect structure including a continuous capping as shown in FIG. 1 than it is for an interconnect structure including a recessed metal interconnect and a discontinuous capping layer (see FIG. 8). As will be described in greater detail below, the corner-to-corner distance increases because of the presence provided by the height of the interlayer dielectric intermediate adjacent metal interconnects including a recessed metal conductor.

Detailed embodiments of the integrated circuit including at least one metal interconnect layer and methods for fabricating an integrated circuit including the at least one metal interconnect layer according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Turning now to FIGS. 2-8, schematically illustrated is a process flow for forming an integrated circuit including at least one metal interconnect layer having a discontinuous capping layer according to one or more embodiments of the invention.

Figure 2:
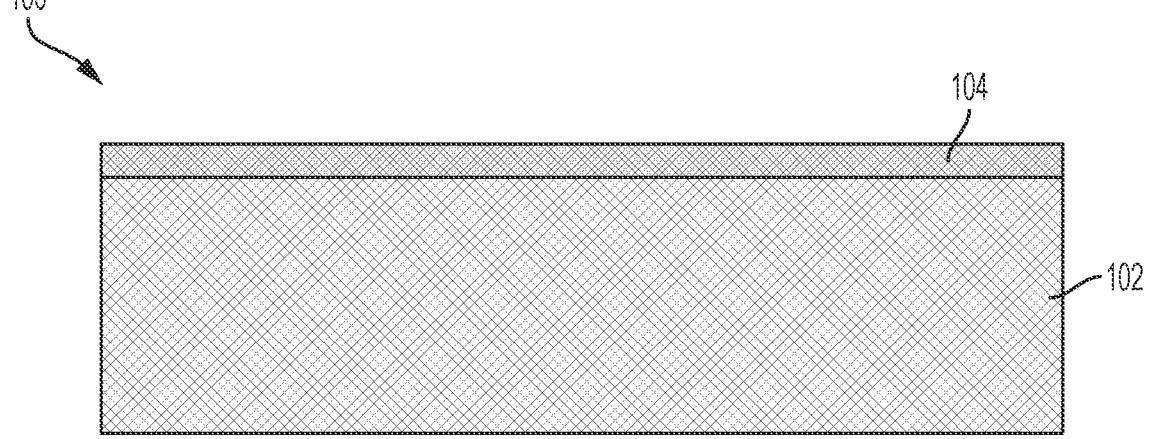
FIG. 2 depicts a cross section of an initial structure of an interlayer dielectric and a hardmask for forming a metal interconnect structure in accordance with one or more embodiments of the present invention.

In FIG. 2, there is shown a portion of an integrated circuit 100 including an interlayer dielectric 102. The interlayer dielectric can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 102 can be deposited by PECVD procedures as is generally known in the art.

An optional hardmask layer 104 can be deposited on the interlayer dielectric. The hardmask layer is not intended to be limited and can be, for example, titanium, titanium nitride, silicon nitride, or the like. The can be deposited by PECVD (for silicon nitride and derivatives) or PVD (for titanium nitride) procedures as is generally known in the art.

Figure 3:
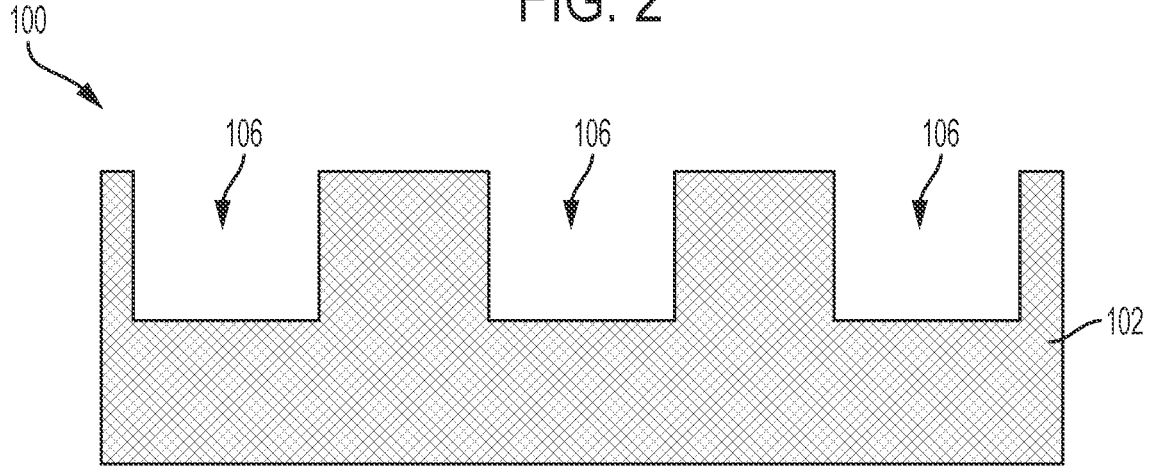
FIG. 3 depicts a cross section of the structure of FIG. 2 subsequent to patterning the interlayer dielectric in accordance with one or more embodiments of the present invention.

In FIG. 3, the interlayer dielectric 102 is lithographically patterned and etched to form one or more openings 106, three of which are shown. The lithographic process for forming the one or more openings in the interlayer dielectric 102 generally includes deposition of a trilayer (not shown) including an organic planarizing layer, a silicon antireflective coating layer and a photoresist onto the surface of the hardmask layer 102. The photoresist is sensitive to radiation, e.g., extreme ultraviolet (EUV) radiation, and, depending on the photoresist used, portions of the photoresist that are exposed to the radiation can be removed (or left remaining) by a development process. The one or more openings 106 are then formed in the interlayer dielectric by etching or otherwise modifying the interlayer dielectric in the areas from which the photoresist has been removed. For example, a reactive ion etch process can be used to anisotropically remove portions of the interlayer dielectric layer 102 to form the one or more openings. The particular pattern is not intended to be limited and can include a trench feature, a via feature, combinations thereof, or the like.

Figure 4:
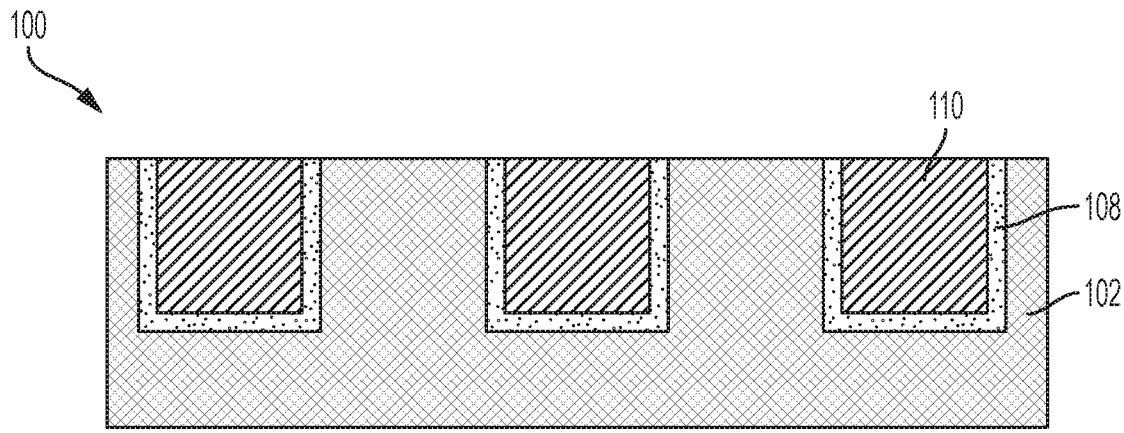
FIG. 4 depicts a cross section of the structure of FIG. 3 subsequent to subsequent to post-metallization and planarization in accordance with one or more embodiments of the present invention.

In FIG. 4, a liner layer 108 (i.e., diffusion barrier layer) is conformally deposited onto the patterned interlayer dielectric 102. For example, tantalum, tantalum nitride, cobalt, ruthenium, titanium, titanium nitride, tungsten nitride, and combinations of more than one material (for example tantalum nitride/tantalum or tantalum nitride/cobalt). The presence of the liner layer such as titanium nitride, for example, insures that a metal such copper, which can participate in interdiffusion during subsequent annealing processes, will not further diffuse into interlayer dielectric. The liner layer 108 can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer 110 can be formed by CVD, sputtering, electrochemical deposition or like processes. For example, the deposition of copper can proceed by electrochemical deposition such as electroplating or electroless plating.

Examples of suitable copper electroplating compositions are described in U.S. Pat. No. 6,911,229 assigned to International Business Machines Corporation, the entire description of which is incorporated by reference in its entirety.

Following formation of the metal layer 110, the substrate is subjected to a planarization process to remove any metal overburden (includes seed layer and liner layer removal) such that a top surface of the metal is substantially coplanar to the low k dielectric layer as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Figure 5:
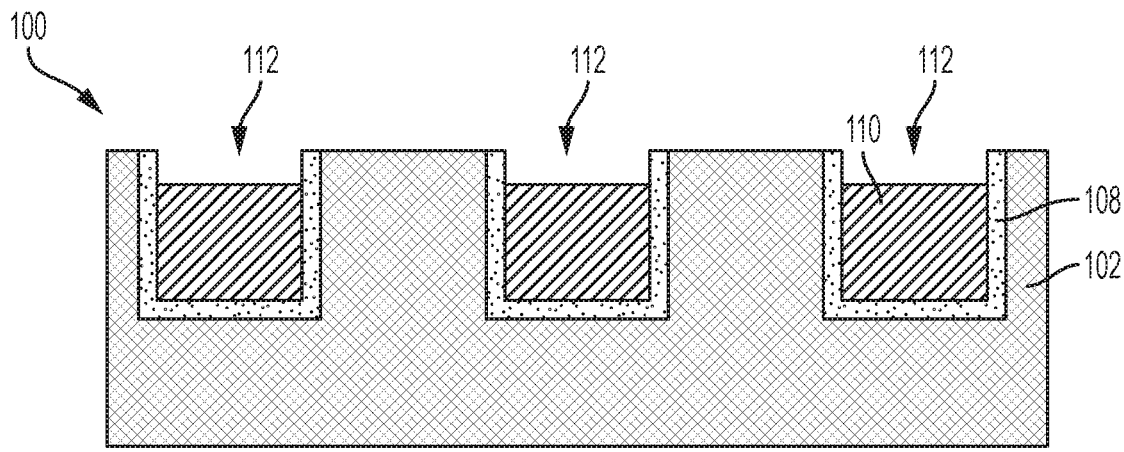
FIG. 5 depicts a cross section of the structure of FIG. 4 subsequent to recessing the bulk conductor in the interlayer dielectric in accordance with one or more embodiments of the present invention.

In FIG. 5, the recess 112 is formed by removing a portion of the bulk metal used to form the metal interconnect. Removal can be effected using a wet etch process. In one or more embodiments, the wet etch process is a time controlled dip in the etch solution. Suitable etch solutions will generally depend on the metal used to form the metal interconnect and its selectivity relative to the dielectric material. Exemplary wet etchants include a mixture of (hydrogen peroxide, KOH, benzotriazole, 1, 2-diaminocyclohexanetetraacetic acid disodium salt), an SC1 solution ($NH_4OH:H_2O_2:H_2O$)/ HF, $HNO_3$, HCl, $H_2SO_4$, HF, $H_2O_2$/alanine, or combinations thereof.

Figure 6:
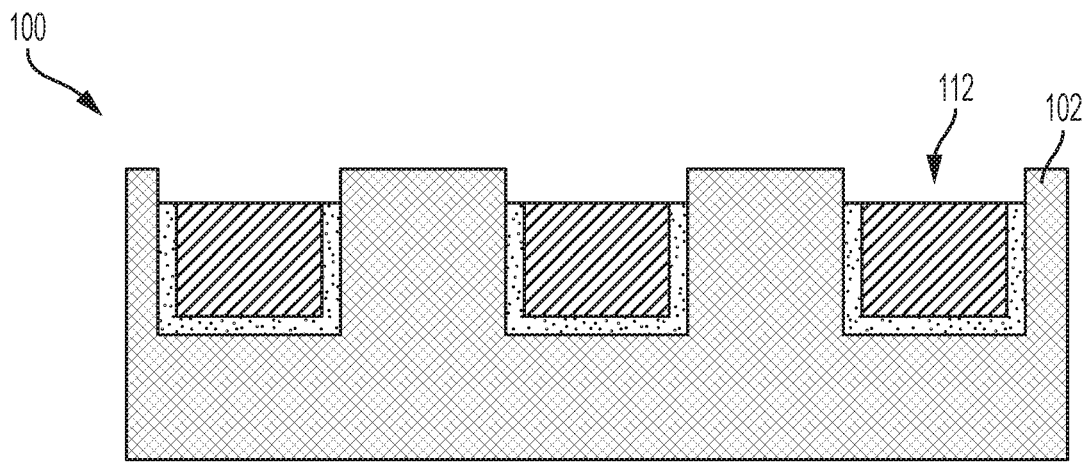
FIG. 6 depicts a cross section of the structure of FIG. 5 subsequent to liner removal above an uppermost surface of the recessed bulk conductor in accordance with one or more embodiments of the present invention.

In FIG. 6, the portion of the liner layer 108 that is exposed subsequent to forming the recess is removed, i.e., complete removal of the liner layer to the bulk metal surface. As such, the interlayer dielectric 102 between adjacent metal interconnects remains, which is generally equal to a recess height. In one or more embodiments, the recess 112 is less than about 25% of the height of the opening 106. In one or more other embodiments, the recess 112 is less than about 20% of the opening height and in still recess 112 is less than about 10% of the opening height. The exposed portion of the liner layer 108 can be selectively removed using wet etch chemistry. Suitable etch solutions will generally depend on the material used to form the liner layer and its selectivity relative to the dielectric material. Exemplary wet etchants include a mixture of (hydrogen peroxide, KOH, benzotriazole, 1,2-diaminocyclohexanetetraacetic acid disodium salt), a mixture of (periodic acid, KOH, and boric acid), hot SC1 or the like.

Figure 7:
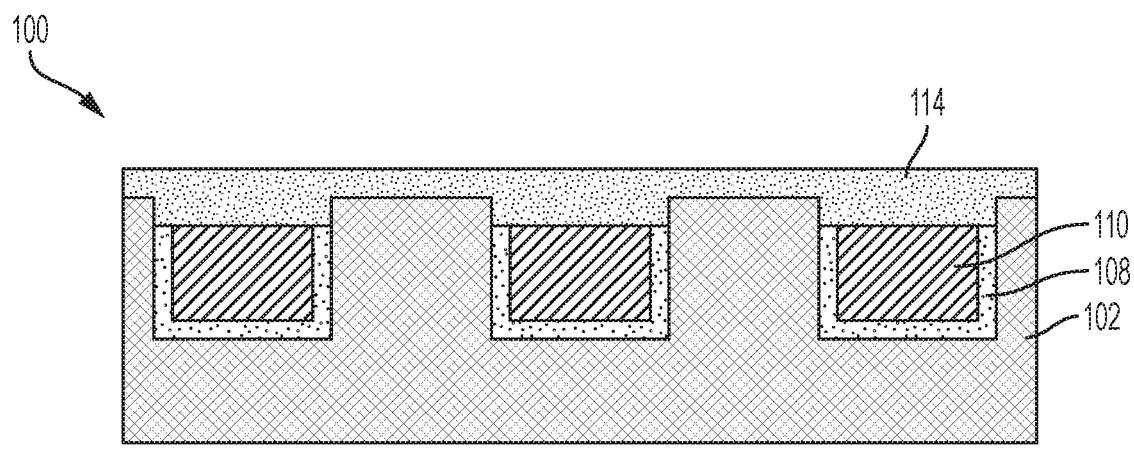
FIG. 7 depicts a cross section of the structure of FIG. 6 subsequent to deposition of a capping layer in accordance with one or more embodiments of the present invention.

In FIG. 7, capping layer 114 is deposited ono the substrate. The capping layer 114 protects the underlying metal conductive line from oxidation, humidity, and contamination during processing of the next metal levels on the semiconductor wafer. Additionally, capping layer 114 serves to prevent undesirable diffusion of the underlying conductive line into dielectric layer. Capping layer 114 can be made of any suitable capping material such as silicon nitride, silicon carbide, silicon (nitrogen, hydrogen, carbon), silicon oxycarbide, hydrogenated silicon carbide, silicon dioxide, organosilicate glass, and other low-k dielectrics.

Figure 8:
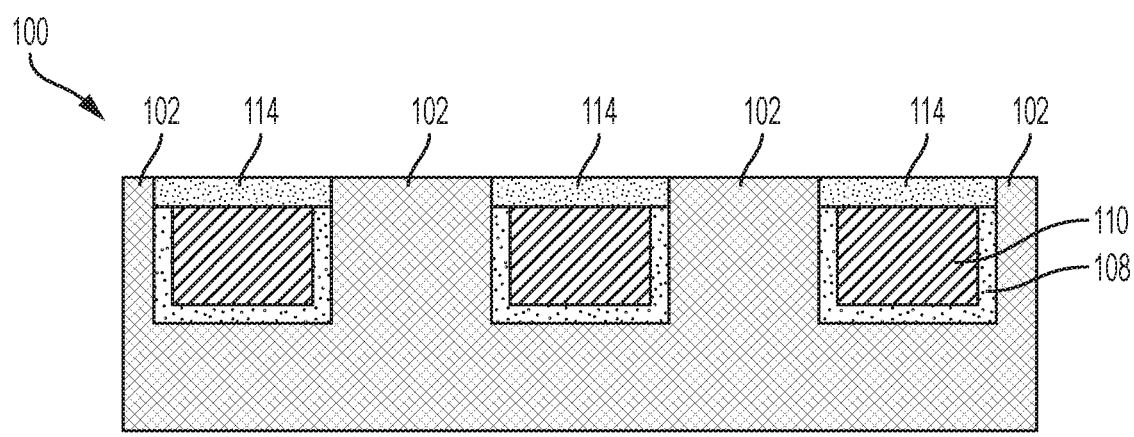
FIG. 8 depicts a cross section of the structure of FIG. 7 subsequent to planarization to the interlayer dielectric in accordance with one or more embodiments of the present invention.

In FIG. 8, the substrate is subjected to a planarization process to remove any excess capping layer 114 such that the layer above the metal interconnect is a discontinuous layer 114 of the capping material and the dielectric layer as shown. The uppermost surface of the metal interconnect is below the uppermost surface of the interlayer dielectric because of its prior recess. For example, the surface can be planarized using an electropolishing process. As noted above, the corner-to-corner distance increases relative to the prior art because of the presence provided by the height of the interlayer dielectric intermediate adjacent metal interconnects including the recessed metal conductor and the discontinuous capping layer 114 thereon.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A process for forming a metal interconnect layer, the process comprising:
    lithographically patterning and etching an interlayer dielectric to form one or more openings;
    conformally depositing a liner layer into the one or more openings;
    following deposition of the liner layer, depositing a metal into the one or more openings and on the liner layer;
    planarizing a surface to remove an excess of the metal such that the uppermost surfaces of the metal and the interlayer dielectric are coplanar to each other;
    removing a portion of the metal to form a recess, wherein the uppermost surface of the metal is below the uppermost surface of the interlayer dielectric;
    removing a portion of the liner layer within the recess subsequent to removing the portion of the metal to form the recess;
    depositing a capping layer thereon to fill the recess, wherein a portion of sidewalls of the capping layer directly contacts the interlayer dielectric; and
    planarizing a surface to remove excess capping layer such that the uppermost surfaces of the capping layer and the interlayer dielectric are coplanar to each other and the uppermost surface of the metal is below the uppermost surfaces of the capping layer and the interlayer dielectric,
    wherein the capping layer comprises silicon carbide, silicon (nitrogen, hydrogen, carbon), silicon oxycarbide, hydrogenated silicon carbide, silicon dioxide, or an organosilicate glass.

2. The process of claim 1, wherein removing the portion of the metal to form the recess comprises a wet etching process.

3. The process of claim 2, wherein the wet etching process is time based.

4. The process of claim 3, wherein the wet etching process comprises applying a wet etchant solution comprising an SC1 solution ($NH_4OH:H_2O_2:H_2O$)/HF, $HNO_3$, HCl, $H_2SO_4$, HF, $H_2O_2$/alanine, or combinations thereof.

5. The process of claim 1, wherein the metal comprises Cu, Co, Al, AlCu, Ti, TiN, Ta, TaN, W, WN, MoN, Pt, Pd, Os, Ru, $IrO_2$, $ReO_2$, $ReO_3$, alloys thereof, or mixtures thereof.

6. The process of claim 1, wherein depositing the metal into the one or more openings further comprises deposition of a seed layer following deposition of the liner layer.

7. The process of claim 1, wherein the interlayer dielectric comprises $SiO_2$, silsesquioxanes, carbon doped oxides that include atoms of Si, C, O and H, thermosetting polyarylene ethers, or multilayers thereof.

8. The process of claim 1, further comprising removing a portion of the liner layer within the recess comprises a wet etching process.

9. The process of claim 1, further comprising removing a portion of the liner layer within the recess by exposing the portion of the liner layer to a solution comprising a mixture of (hydrogen peroxide, KOH, benzotriazole, 1, 2-diaminocyclohexanetetraacetic acid disodium salt), a mixture of (periodic acid, KOH, and boric acid), or a mixture of ($NH_4OH:H_2O_2:H_2O$)/HF, $HNO_3$, HCl, $H_2SO_4$, HF, $H_2O_2$/alanine.

10. The process of claim 1, wherein the recess is less than about 25% of the height of the one or more openings.

11. The process of claim 1, wherein the recess is less than about 20% of a height of the one or more openings.

12. The process of claim 1, wherein the recess is less than about 10% of a height of the one or more openings.

13. The process of claim 1, wherein depositing the capping layer thereon to fill the recess results in the capping layer overlying a portion of the liner layer and the metal.

* * * * *